(12) United States Patent
Nakai et al.

(10) Patent No.: US 6,414,247 B1
(45) Date of Patent: Jul. 2, 2002

(54) GLASS CERAMIC BOARD

(75) Inventors: Hideaki Nakai, Shiga-ken; Hirofumi Sunahara, Moriyama; Sadaaki Sakamoto, Shiga-ken, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/443,230

(22) Filed: Nov. 18, 1999

(30) Foreign Application Priority Data

Dec. 24, 1998 (JP) ............................................. 10-367015

(51) Int. Cl.[7] .................................................. H05K 1/09
(52) U.S. Cl. ......................................... 174/257; 174/250
(58) Field of Search ................................. 174/255, 256, 174/261, 250, 257, 258; 264/610; 428/901

(56) References Cited

U.S. PATENT DOCUMENTS

| | | | | |
|---|---|---|---|---|
| 4,816,200 A | * | 3/1989 | Stecher et al. ................. | 264/59 |
| 4,882,212 A | * | 11/1989 | SinghDeo et al. ............. | 428/76 |
| 4,906,514 A | * | 3/1990 | Francis et al. ............... | 428/209 |
| 4,986,945 A | * | 1/1991 | LaRoche, Jr. ................. | 264/60 |
| 4,998,159 A | * | 3/1991 | Shinohara et al. ............ | 357/80 |
| 5,167,271 A | * | 12/1992 | Lange et al. ................. | 164/103 |
| 5,194,196 A | * | 3/1993 | Chance et al. ............. | 264/40.1 |
| 5,216,207 A | * | 6/1993 | Prabhu et al. ............... | 174/256 |
| 5,880,406 A | * | 3/1999 | Gerstel et al. ............... | 174/256 |
| 5,948,192 A | | 9/1999 | Hiroyuki et al. | |

FOREIGN PATENT DOCUMENTS

JP          7135379          5/1995

OTHER PUBLICATIONS

Merriam–Webster's Collegiate Dictionary, Tenth Edition, principal copyright 1993, pp. 31 and 830.*

* cited by examiner

*Primary Examiner*—Kamand Cuneo
*Assistant Examiner*—Jeremy Norris
(74) *Attorney, Agent, or Firm*—Dickstein, Shapiro, Morin & Oshinsky, LLP.

(57) ABSTRACT

A glass ceramic multilayer circuit board uses Ag as a conductive material, in which oxidation and diffusion of silver are suppressed. The glass ceramic multilayer circuit board is formed by stacking glass ceramic layers and conductor layers, and then simultaneously burning the layered product. The glass ceramic layers are made of a glass ceramic insulating material which is composed of a glass component and a ceramic component, and to which a metal powder of Cu, Ni or the like is added.

20 Claims, 1 Drawing Sheet

GLASS CERAMIC BOARD

BACKGROUND OF THE INVENTION

1. Field of the Invention

The present invention relates to a glass ceramic board formed by simultaneously burning a glass ceramic insulating material and a silver-type conductive material at a predetermined burning temperature.

2. Description of the Related Art

There have recently been great demands for decreasing the size and cost of electronic apparatus such as a portable telephone terminal, a computer or the like, and improving the function and reliability thereof, and electronic parts such as semiconductor IC, etc. have significantly developed to high density integration, and high speed operation with these demands. Accordingly, conductive materials used as a substrate material on which electronic parts are mounted are required to have higher characteristics than alumina substrate materials and tungsten conductive materials.

Particularly, alumina has a high dielectric constant and thus has a problem of delay of signal propagation in a wiring pattern. Alumina also has a large difference in thermal expansion coefficient from silicon or the like and thus causes deterioration in reliability due to thermal cycling. Furthermore, since alumina has a high sintering temperature, a high-melting-point metal such as tungsten, molybdenum or the like must be used as the conductive material. However, these high-melting-point metals have high resistivity and thus have the problem of causing difficulties in high-density wiring.

With refinement of a conductor (wiring) pattern and increases in signal frequency, an attempt is made to use a glass ceramic multilayer circuit board comprising a glass ceramic material burnable at 1000° C. or less, and a low-melting-point metal conductive material having low resistivity, such as copper, silver, gold, platinum, silver-palladium alloy, or the like.

Of these conductive materials, gold and platinum are burnable in the air, but the material cost thereof is high. Copper is required to be burned under strict control in a reducing atmosphere, and thus has the problem of high burning cost, etc. Therefore, silver-type conductive material are widely used, as they have a relatively low material cost and are burnable in air and thus have low burning cost.

However, silver-type conductive materials such as silver, silver-palladium alloys and the like, readily diffuse as compared with other conductor materials, and thus cause a short circuit between wirings due to contact between the diffused silver particles, thereby making the reliability of the obtained wiring board unstable. In addition, the diffused silver particles produce a silver colloid, and thus cause discoloration of the board due to the silver colloid, deteriorating the quality of the board. Particularly, in a glass ceramic multilayer circuit board, silver is readily diffused into the glass component, and thus the suppression of silver diffusion is a great problem.

SUMMARY OF THE INVENTION

To overcome the above described problems, preferred embodiment of the present invention provide a glass ceramic board with high reliability and high quality, in which silver diffusion of a silver-type conductive material can be suppressed.

One preferred embodiment of the present invention provides a glass ceramic board formed by simultaneously burning a glass ceramic insulating material, and a silver-type conductive material at a predetermined burning temperature, wherein a metal stably or metastably present at room temperature and forming an oxide at the burning temperature is added to the glass ceramic insulating material.

In the above described glass ceramic board, the metal may be at least one selected from the group consisting of aluminum, silicon, titanium, vanadium, chromium, iron, cobalt, nickel, copper, zinc and gallium.

In the above described glass ceramic board, the metal may be copper.

In the above described glass ceramic board, the amount of the metal added may be about 3% by weight or less based on the glass ceramic insulating material.

In the above described glass ceramic board, the glass component of the glass ceramic insulating material may be at least one selected from the group silicate glass, borosilicate glass and $CaO—SiO_2—Al_2O_3—B_2O_3$ glass.

In the above described glass ceramic board, the ceramic component of the glass ceramic insulating material may be at least one selected from the group consisting of alumina, silica, zirconia, forsterite, anorthite and wollastonite.

In the above described glass ceramic board, the weight ratio of the glass component to the ceramic component in the glass ceramic insulating material may be about 10:90 to 100:0.

The above described glass ceramic board may comprise a multi-layer board comprising a lamination of a glass ceramic insulating layer and a silver-type conductive layer, with the silver-type conductive material being used for surface conductor patterns and/or inner conductor patterns.

In the above described glass ceramic board, a metal which is stably or metastably present at room temperature and which forms an oxide at a burning temperature of 700 to 960° C., i.e. lower than the melting point of silver, is added to the glass ceramic insulating material. Therefore, for example, at the burning temperature in a non-reducing atmosphere such as the air or the like, oxidation and diffusion of the silver-type conductive material are suppressed, thereby obtaining a glass ceramic board having high reliability and high quality. This is due to the fact that the metal is more easily oxidized than the silver-type conductive material which forms conductor patterns, and functions as a reductant for the silver-type conductive material.

Other features and advantages of the present invention will become apparent from the following description of the invention which refers to the accompanying drawings.

BRIEF DESCRIPTION OF THE DRAWING

The sole FIGURE is a schematic sectional view of a glass ceramic board in accordance with an embodiment of the present invention.

DESCRIPTION OF THE PREFERRED EMBODIMENT

Figure 1:
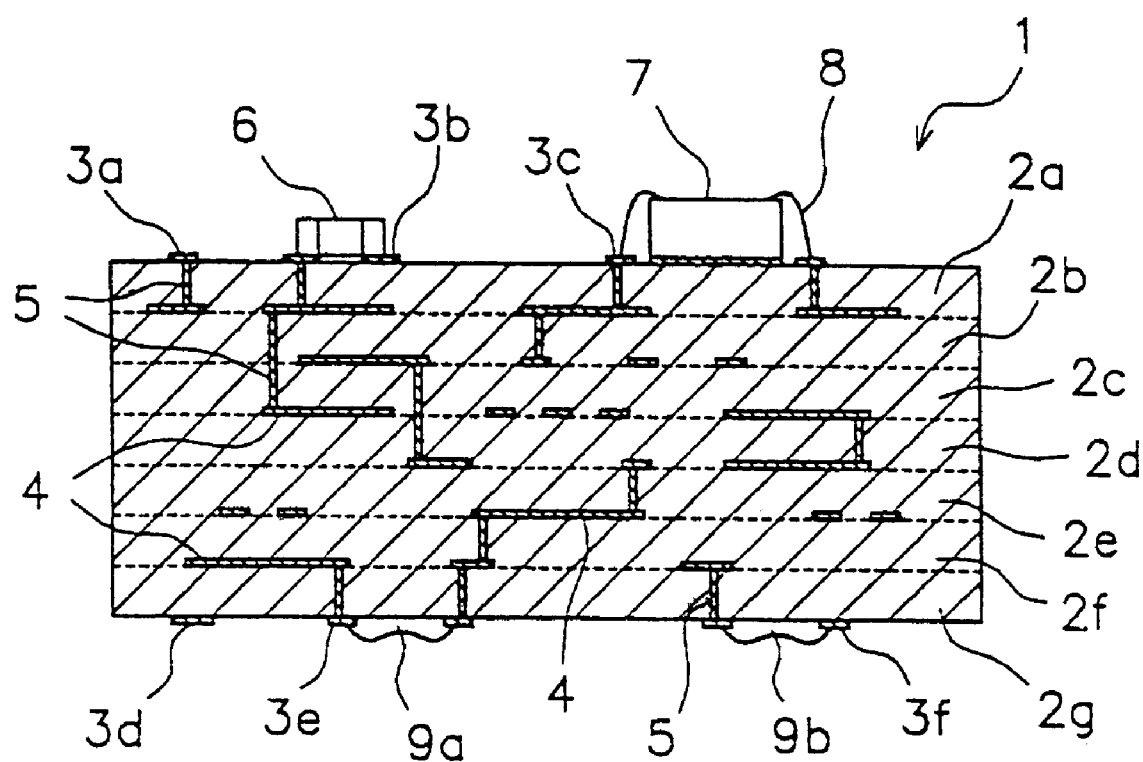

A glass ceramic board in accordance with an embodiment of the present invention will be described below with reference to the FIGURE.

A glass ceramic board 1 of this embodiment is a multi-layer circuit board comprising a lamination of insulating glass ceramic layers 2a, 2b, 2c, 2e, 2f and 2g, and conductor patterns made of a silver-type conductive material. On both main surfaces of the glass ceramic board 1 are formed surface conductor patterns 3a, 3b, 3c, 3d, 3e and 3f such as an electrode pad, a wiring pattern, etc. In the glass ceramic board 1 are formed internal conductor patterns 4 such as a wiring pattern of a strip line, etc., and electrode patterns of a coil, a capacitor, etc. The respective internal conductor patterns 4, or the internal conductor patterns and the surface conductor patterns, are electrically connected by via holes 5.

On one of the main surfaces of the gall ceramic board 1, chip parts 6 such as a chip capacitor, and the like, and semiconductor integrated circuits 7 are connected to the surface conductor patterns 3b and 3c, respectively, directly or through wires 8. On the other main surface of the glass ceramic board 1, thick-film resistors 9a and 9b are formed on the surface conductor patterns 3e and 3f, respectively.

The surface conductor patterns 3a to 3f, and the internal conductor patterns 4 are made of a silver-type conductive material such as Ag, Ag-Pd, Ag-Pt or the like. The glass ceramic layers 2a to 2g are insulating glass ceramic layers formed by burning a material mixture comprising a glass ceramic insulating material which is composed of a glass component and a ceramic component, and to which a metal stably or metastably present at room temperature is added for forming an oxide at a burning temperature of about 700 to 960° C. in a non-reducing atmosphere.

In the glass ceramic board 1 which experiences burning, the surface conductor patterns and the internal conductor patterns made of a silver-type conductive material are conductor patterns with excellent reliability in which oxidation is suppressed by the metal in the glass ceramic insulating material, causing less diffusion and danger of short circuits between wirings and between electrodes. Since discoloration of the board due to the production of a silver colloid is also suppressed, the glass ceramic board 1 is high in quality.

Particularly, the volume ratio and weight ratio of the board material to the whole glass ceramic board 1 are high, and thus the addition of the metal to the glass ceramic insulating material has substantially no influence on the board properties such as strength, dielectric constant, etc. On the other hand, for example, when the metal is contained in a conductive material, the same effect as described above cannot be expected unless a too high ratio of metal is added because the absolute amount of the metal to be contained is limited, and the wiring resistance is increased when an oxide is mixed in the conductor patterns.

The added metal is present as an oxide in the glass ceramic layers 2a to 2g after burning. The metal oxide is dissolved in the form of a metal ion in the glass component together with oxygen. Particularly, in the use of copper as the metal, a blue color of $Cu^{2+}$ is observed.

An example of the method of manufacturing the glass ceramic board will be described below.

First, predetermined amounts of glass powder, ceramic powder and metal powder are mixed with an organic vehicle, and the resultant mixture is dispersed to produce a slurry for the glass ceramic layer. The thus-obtained slurry is formed into a sheet by the doctor blade method or the like to produce a ceramic green sheet for a glass ceramic layer.

A silver-type conductive material is mixed with an organic vehicle, and then dispersed to produce silver-type conductive paste. The silver-type conductive paste is screen-printed on the ceramic green sheet to form a predetermined conductor pattern. If required, via holes are formed in the ceramic green sheet. The via holes may be filled using the silver-type conductor paste.

Then, a plurality of the ceramic green sheets on which the predetermined conductor pattern is formed are stacked, compressed and then burned at about 700 to 960° C. The chip part 6 and the semiconductor IC 7 are mounted, and the thick-film resistors 9a and 9b are printed to obtain the laminated glass ceramic board 1 comprising the surface conductor patterns 3a to 3f, the internal conductor patterns 4, and the insulating glass ceramic layers 2a to 2g.

Besides the ceramic green sheet method, the glass ceramic board of the present invention may be formed by a thick-film printing method.

The glass ceramic board of the present invention will be described in further detail below.

The glass ceramic board of the present invention is obtained by simultaneously burning a glass ceramic insulating material and a silver-type conductive material at a predetermined burning temperature, wherein a metal stably or metastably present at room temperature is added to the glass ceramic insulating material for forming an oxide at the burning temperature.

The melting point of silver is 962° C., and thus the burning temperature is preferably about 700 to 960° C. Since alkali metals and alkali earth metals are unstable at room temperature in the atmosphere, and are significantly oxidized, the metal added to the glass ceramic insulating material is required to be present in a stable or metastable state at room temperature in the atmosphere.

In the glass ceramic board of the present invention, the metal is preferably at least one selected from the group consisting of aluminum (Al), silicon (Si), titanium (Ti), vanadium (V), chromium (Cr), manganese (Mn), iron (Fe), cobalt (Co), nickel (Ni), copper (Cu), zinc (Zn) and gallium (Ga).

These metals are stable or metastable at room temperature in the atmosphere, and easily form oxides at a burning temperature of about 700 to 960° C. As the metal, particularly copper is preferred from the viewpoint of the high thermodynamic rate of oxidation, and the duration of effect over a wide range.

The amount of the metal added is preferably about 3% by weight or less based on the glass ceramic insulating material comprising the glass component and the ceramic component. The addition of over 3% by weight of metal deteriorates the sinterability of the board due to oxidative expansion of the metal and decreases the density and strength of the board, adversely affecting reliability. The amount of the metal added is more preferably about 0.01% by weight to about 1.0% by weight because oxidation of the silver-type conductive material can be sufficiently suppressed, and the strength of the board can be maintained.

In the glass ceramic board of the present invention, the glass component of the glass ceramic insulating material is preferably at least one selected from the group consisting of silicate glass, borosilicate glass and $CaO$—$SiO_2$—$Al_2O_3$—$B_2O_3$ glass.

The ceramic component of the glass ceramic insulating material is preferably at least one selected from the group consisting of alumina, silica, zircon, forsterite, anorthite and wollastonite. These ceramic components (ceramic fillers) are relatively inexpensive materials having less adverse effect on electrical properties.

In the glass ceramic insulating material, the weight ratio of the glass component to the ceramic component is preferably about 10:90 to 100:0. With a glass component/ceramic component ratio lower than the above weight ratio, burning at temperature lower than the melting point (962° C.) of silver is difficult.

The glass ceramic board of the present invention is a multilayer circuit board formed by stacking a plurality of glass ceramic insulating layers and silver-type conductor layers, wherein the silver-type conductive material may be used for the surface conductor patterns and/or the internal conductor patterns.

In the glass ceramic board of the present invention, the silver-type conductive material may be used for various surface conductor patterns and the internal conductor patterns of a wire bonding electrode pad, soldering electrode pad, a ground electrode, a capacitor electrode, a coil electrode, a strip line, etc. The glass ceramic board of the present invention can be used for a hybrid IC circuit board, various high-frequency module circuit boards for a piezoelectric control oscillator, a PLL module, etc., as well as various ceramic electronic parts such as a ceramic package, a chip capacitor, a chip coil, a LC filter, a chip delay line, etc.

The present invention will be described with reference to examples.

EXAMPLES

Powders of $R_2O$ (wherein R is Na or K), R'O (wherein R' is Mg or Ca), $Al_2O_3$, $SiO_2$, and $B_2O_3$ were mixed at predetermined ratios and the resultant mixture was melted in a platinum crucible, melted and then quenched to obtain various types of glass. The obtained glasses had the compositions shown in Table 1 below. Then, each of the obtained types of glass was ground to an average particle size of 1.2 to 2.4 mm to obtain a glass powder for a glass ceramic insulating material.

TABLE 1

| Glass type* | Li | Na | K | Mg | Ca | Ba | Si | B | Al | Melting temp. (° C.) |
|---|---|---|---|---|---|---|---|---|---|---|
| a | 0 | 0 | 0 | 0 | 37.8 | 0 | 42.6 | 16.4 | 3.2 | 1400 |
| b | 0 | 1 | 1 | 18 | 42 | 0 | 38 | 0 | 0 | 1600 |
| c | 11.7 | 0 | 0 | 9.8 | 0 | 23.2 | 26.4 | 28.9 | 0 | 1100 |

*a: $CaO$—$SiO_2$—$Al_2O_3$—$B_2O_3$ glass,
b: silicate glass,
c: borosilicate glass Then, a predetermined amount of each of various ceramic powders was mixed with the glass powder for a glass ceramic insulating material, and a predetermined amount of each of various metal powders was added to prepare powder mixtures. Eight parts by weight of butyral binder, 2 parts by weight of dioctyl phthalate, 1 part by weight of dispersant, 30 parts by weight of ethanol, and 30 parts by weight of toluene were added to 100 parts by weight of powder mixture, and then mixed by a ball mill for 24 hours to obtain a glass ceramic slurry. The glass ceramic slurry was degassed under vacuum, and then formed into a ceramic green sheet having a thickness of 100 mm by the doctor blade method.

Next, a conductive paste containing silver as a main component was printed in a predetermined conductor pattern on the ceramic green sheet. Ten ceramic green sheets were stacked, followed by thermocompression bonding at 500 kg/cm$^2$ and 60° C. to obtain a layered product. The layered product was degreased at 400° C., and then burned in the atmosphere at 860° C. for 30 minutes to obtain a glass ceramic multilayer circuit board. Tables 2A and 2B below show the type and amount of the glass powder added, the type of the ceramic powder used and the type and amount of the metal powder added.

TABLE 2A

| | Glass powder | | Type of ceramic powder* | Metal powder | |
|---|---|---|---|---|---|
| Example | Type | Amount (wt %) | | Type | Amount (wt %) |
| 1 | a | 10 | A | — | 0 |
| 2 | a | 40 | A | — | 0 |
| 3 | a | 50 | A | — | 0 |
| 4 | a | 60 | A | — | 0 |
| 5 | a | 80 | A | — | 0 |
| 6 | a | 90 | A | — | 0 |
| 7 | a | 100 | A | — | 0 |
| 8 | a | 50 | B | — | 0 |
| 9 | a | 50 | C | — | 0 |
| 10 | a | 50 | D | — | 0 |
| 11 | a | 50 | E | — | 0 |
| 12 | a | 50 | F | — | 0 |
| 13 | b | 50 | A | — | 0 |
| 14 | c | 50 | A | — | 0 |
| 15 | a | 50 | A | Cu | 0.01 |
| 16 | a | 50 | A | Cu | 0.05 |
| 17 | a | 50 | A | Cu | 0.1 |
| 18 | a | 50 | A | Cu | 0.2 |
| 19 | a | 50 | A | Cu | 0.5 |
| 20 | a | 50 | A | Cu | 1 |
| 21 | a | 50 | A | Cu | 3 |
| 22 | a | 50 | A | Cu | 5 |
| 23 | a | 10 | A | Cu | 0.1 |
| 24 | a | 10 | A | Cu | 0.5 |
| 25 | a | 10 | A | Cu | 1 |
| 26 | a | 20 | A | Cu | 0.1 |
| 27 | a | 20 | A | Cu | 0.5 |
| 28 | a | 20 | A | Cu | 1 |
| 29 | a | 40 | A | Cu | 0.1 |
| 30 | a | 40 | A | Cu | 0.5 |

*A: alumina,
B: silicon oxide,
C: zirconium oxide,
D: forsterite
E: anorthite,
F: wollastonite

TABLE 2B

| | Glass powder | | Type of ceramic powder* | Metal powder | |
|---|---|---|---|---|---|
| Example | Type | Amount (wt %) | | Type | Amount (wt %) |
| 31 | a | 40 | A | Cu | 1 |
| 32 | a | 60 | A | Cu | 0.1 |
| 33 | a | 60 | A | Cu | 0.5 |
| 34 | a | 60 | A | Cu | 1 |
| 35 | a | 80 | A | Cu | 0.1 |
| 36 | a | 80 | A | Cu | 0.5 |
| 37 | a | 80 | A | Cu | 1 |
| 38 | a | 90 | A | Cu | 0.1 |
| 39 | a | 90 | A | Cu | 0.5 |
| 40 | a | 90 | A | Cu | 1 |
| 41 | a | 100 | A | Cu | 0.1 |
| 42 | a | 100 | A | Cu | 0.5 |
| 43 | a | 100 | A | Cu | 1 |
| 44 | a | 50 | A | Ni | 0.1 |
| 45 | a | 50 | A | Zn | 0.1 |
| 46 | a | 50 | A | Al | 0.1 |
| 47 | a | 50 | A | Ga | 0.1 |
| 48 | a | 50 | B | Cu | 0.1 |
| 49 | a | 50 | C | Cu | 0.1 |
| 50 | a | 50 | D | Cu | 0.1 |
| 51 | a | 50 | E | Cu | 0.1 |
| 52 | a | 50 | F | Cu | 0.1 |

TABLE 2B-continued

| Example | Glass powder Type | Glass powder Amount (wt %) | Type of ceramic powder* | Metal powder Type | Metal powder Amount (wt %) |
|---|---|---|---|---|---|
| 53 | b | 50 | A | Cu | 0.1 |
| 54 | c | 50 | A | Cu | 0.1 |

*A: alumina,
B: silicon oxide,
C: zirconium oxide,
D: forsterite
E: anorthite,
F: wollastonite A section of the thus-obtained glass ceramic multilayer circuit board was polished so that discoloration was examined by observation by an optical microscope, and a diffusion length of silver was measured on the basis of WDX (Wavelength Dispersive X-Ray Spectrometry). The density and transverse strength of the board were also measured. Table 3A and 3B below show the results of measurement of the presence of discoloration, the diffusion length of silver and the density and transverse strength of the board.

TABLE 3A

| Example | Discoloration | Diffusion length of silver (mm) | Density (g/cm³) | Strength (MPa) |
|---|---|---|---|---|
| 1 | Present | 50 | 3.51 | 370 |
| 2 | Present | 59 | 3.27 | 330 |
| 3 | Present | 62 | 3.19 | 315 |
| 4 | Present | 63 | 3.10 | 300 |
| 5 | Present | 68 | 2.92 | 270 |
| 6 | Present | 70 | 2.82 | 250 |
| 7 | Present | 73 | 2.71 | 190 |
| 8 | Present | 52 | 2.55 | 210 |
| 9 | Present | 58 | 4.13 | 285 |
| 10 | Present | 56 | 2.82 | 245 |
| 11 | Present | 60 | 2.58 | 230 |
| 12 | Present | 55 | 2.67 | 255 |
| 13 | Present | 53 | 2.95 | 290 |
| 14 | Present | 58 | 3.15 | 300 |
| 15 | Absent | 50 | 3.18 | 310 |
| 16 | Absent | 48 | 3.17 | 305 |
| 17 | Absent | 46 | 3.17 | 305 |
| 18 | Absent | 45 | 3.15 | 300 |
| 19 | Absent | 44 | 3.10 | 295 |
| 20 | Absent | 44 | 3.02 | 290 |
| 21 | Absent | 42 | 2.71 | 230 |
| 22 | Absent | 44 | 2.39 | 170 |
| 23 | Absent | 42 | 3.49 | 370 |
| 24 | Absent | 40 | 3.42 | 360 |
| 25 | Absent | 43 | 3.33 | 340 |
| 26 | Absent | 41 | 3.41 | 360 |
| 27 | Absent | 40 | 3.34 | 345 |
| 28 | Absent | 40 | 3.26 | 330 |
| 29 | Absent | 46 | 3.25 | 330 |
| 30 | Absent | 48 | 3.18 | 320 |

TABLE 3B

| Example | Discoloration | Diffusion length of silver (mm) | Density (gcm⁻³) | Strength (MPa) |
|---|---|---|---|---|
| 31 | Absent | 43 | 3.10 | 300 |
| 32 | Absent | 47 | 3.08 | 300 |
| 33 | Absent | 46 | 3.02 | 285 |
| 34 | Absent | 45 | 2.94 | 270 |
| 35 | Absent | 47 | 2.90 | 265 |
| 36 | Absent | 44 | 2.84 | 255 |
| 37 | Absent | 47 | 2.77 | 240 |
| 38 | Absent | 40 | 2.81 | 250 |
| 39 | Absent | 48 | 2.75 | 235 |
| 40 | Absent | 49 | 2.68 | 225 |
| 41 | Absent | 50 | 2.71 | 230 |
| 42 | Absent | 52 | 2.66 | 220 |
| 43 | Absent | 49 | 2.59 | 205 |
| 44 | Absent | 46 | 3.17 | 315 |
| 45 | Absent | 44 | 3.17 | 310 |
| 46 | Absent | 39 | 3.12 | 300 |
| 47 | Absent | 42 | 3.14 | 310 |
| 48 | Absent | 44 | 2.54 | 210 |
| 49 | Absent | 42 | 4.11 | 285 |
| 50 | Absent | 46 | 2.81 | 245 |
| 51 | Absent | 44 | 2.57 | 230 |
| 52 | Absent | 45 | 2.66 | 255 |
| 53 | Absent | 39 | 2.95 | 290 |
| 54 | Absent | 44 | 3.15 | 300 |

In each of the glass ceramic multilayer circuit boards of Examples 1 to 14, the glass ceramic insulating material had no metal stable or metastable at room temperature and forming an oxide on burning, and thus discoloration of the board occurred due to a silver colloid. This is due to silver diffusion into the conductor patterns.

On the other hand, each of the glass ceramic multilayer circuit boards of Examples 15 to 54 produced no discoloration due to a silver colloid. This is possibly due to the fact that the metal contained in the glass ceramic insulating material functions as a reducing agent for silver during burning, thereby suppressing oxidation of silver and diffusion thereof, and preventing the discoloration of the board due to the silver colloid.

Examples 15 to 22 reveal that the amount of the metal added, which forms an oxide in burning, is preferably about 3% by weight or less based on the amount of the glass ceramic insulating material because the density and strength of the board are excellent. For example, as in Example 22, the addition of over 3% by weight of metal has the tendency to decrease the strength of the board. This is possibly due to the deterioration in sinterability of the board due to oxidative expansion of the metal. It is also found that the amount of the metal added is more preferably about 0.01% to 1.0% by weight because oxidation and diffusion of silver are sufficiently suppressed, and the board has excellent strength.

In all Examples 23 to 43, a glass ceramic multilayer circuit board having high reliability and high strength is obtained, in which oxidation and diffusion of silver are suppressed. However, in order to ensure the board strength and the burning temperature are well balanced, the amount of the glass powder is preferably about 10% by weight or more.

Examples 44 to 47 indicate that like the case of copper powder, when a nickel powder, zinc powder, aluminum powder or gallium powder is used as the metal powder which is stable or metastable at room temperature and which forms an oxide in burning, a glass ceramic multilayer circuit board with excellent strength and reliability is obtained, in which diffusion of silver is suppressed.

Examples 48 to 52 indicate that like the alumina powder, when a silica powder, zirconia powder, forsterite powder, another powder or wollastonite powder is used as the ceramic powder, a glass ceramic multilayer circuit board with excellent strength and reliability is obtained, in which diffusion of silver is suppressed.

Examples 53 and 54 indicate that like CaO—SiO$_2$—Al$_2$O$_3$—B$_2$O$_3$ glass powder, when silicate glass powder or borosilicate glass powder is used as the glass powder, a glass ceramic multilayer circuit board with excellent strength and reliability is obtained, in which diffusion of silver is suppressed.

The glass ceramic board of the present invention can suppress oxidation of a silver-type conductive material such as Ag, Ag-Pd, Ag-Pt or the like, and can thus suppress the diffusion thereof, thereby obtaining a glass ceramic board having less danger of a short circuit between wirings and high reliability, with the suppression of color nonuniformity.

While the invention has been particularly shown and described with reference to preferred embodiments thereof, it will be understood by those skilled in the art that the forgoing and other changes in form and details may be made therein without departing from the spirit of the invention.

What is claimed is:

1. A glass ceramic board comprising
   a conductive pattern comprising silver, and
   a burned glass ceramic insulating material containing glass, ceramic and an oxide of a metal which is stable or metastable at room temperature,
   wherein the amount of metal oxide present calculated as metal is about 3% by weight or less based on the other components of the glass ceramic insulating material.

2. A glass ceramic board according to claim 1, wherein the metal is at least one member selected from the group consisting of aluminum, silicon, titanium, vanadium, chromium, manganese, iron, cobalt, nickel, copper, zinc and gallium.

3. A glass ceramic board according to claim 2, wherein the glass component of the glass ceramic insulating material is at least one member selected from the group consisting of silicate glass, borosilicate glass and CaO—SiO$_2$—Al$_2$O$_3$—B$_2$O$_3$ glass.

4. A glass ceramic board according to claim 3, wherein the ceramic component of the glass ceramic insulating material is at least one member selected from the group consisting of alumina, silica, zirconia, forsterite, another and wollastonite.

5. A glass ceramic board according to claim 4, wherein the amount of the glass in the glass ceramic insulating material excluding the metal oxide is at least about 10 weight percent.

6. A glass ceramic board according to claim 5, wherein the amount of oxide present calculated as metal is about 0.1–1% by weight or less based on the other components of the glass ceramic insulating material.

7. A glass ceramic board according to claim 6, wherein the metal comprises copper.

8. A multilayer board comprising a plurality of stacked glass ceramic boards according to claim 7, wherein the conductive layer(s) form a surface conductor pattern or an internal conductor pattern or both.

9. A glass ceramic board according to claim 1, wherein the amount of oxide present calculated as metal is about 3% by weight or less based on the other components of the glass ceramic insulating material.

10. A multilayer board comprising a plurality of stacked glass ceramic boards according to claim 9, wherein the conductive layer(s) form a surface conductor pattern or an internal conductor pattern or both.

11. A glass ceramic board according to claim 1, wherein the glass component of the glass ceramic insulating material is at least one member selected from the group consisting of silicate glass, borosilicate glass and CaO—SiO$_2$—Al$_2$O$_3$—B$_2$O$_3$ glass.

12. A multilayer board comprising a plurality of stacked glass ceramic boards according to claim 11, wherein the conductive layer(s) form a surface conductor pattern or an internal conductor pattern or both.

13. A glass ceramic board according to claim 1, wherein the ceramic component of the glass ceramic insulating material is at least one member selected from the group consisting of alumina, silica, zirconia, forsterite, another and wollastonite.

14. A multilayer board comprising a plurality of stacked glass ceramic boards according to claim 13, wherein the conductive layer(s) form a surface conductor pattern or an internal conductor pattern or both.

15. A glass ceramic board according to claim 1, wherein the amount of the glass in the glass ceramic insulating material excluding the metal oxide is at least about 10 weight percent.

16. A multilayer board comprising a plurality of stacked glass ceramic boards according to claim 15, wherein the conductive layer(s) form a surface conductor pattern or an internal conductor pattern or both.

17. A glass ceramic board according to claim 1, wherein the metal comprises copper.

18. A multilayer board comprising a plurality of stacked glass ceramic boards according to claim 17, wherein the conductive layer(s) form a surface conductor pattern or an internal conductor pattern or both.

19. A multilayer board comprising a plurality of stacked glass ceramic boards according to claim 1, wherein the conductive layer(s) form a surface conductor pattern or an internal conductor pattern or both.

20. A glass ceramic board according to claim 1, wherein the metal oxide is the product of oxidizing a metal during burning of the glass ceramic insulating material in a non-reducing atmosphere.

* * * * *